United States Patent
Topaloglu

(10) Patent No.: US 8,336,011 B2
(45) Date of Patent: Dec. 18, 2012

(54) METHODS FOR FABRICATING AN ELECTRICALLY CORRECT INTEGRATED CIRCUIT

(75) Inventor: Rasit Topaloglu, Santa Clara, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 37 days.

(21) Appl. No.: 13/022,432

(22) Filed: Feb. 7, 2011

(65) Prior Publication Data

US 2012/0204134 A1 Aug. 9, 2012

(51) Int. Cl.
*G06F 17/50* (2006.01)
(52) U.S. Cl. .......................................... 716/110
(58) Field of Classification Search ................... 716/100, 716/110

See application file for complete search history.

(56) References Cited

U.S. PATENT DOCUMENTS

| | | | |
|---|---|---|---|
| 7,360,179 B2* | 4/2008 | Smith et al. | 700/121 |
| 7,671,418 B2 | 3/2010 | Topaloglu | |
| 7,958,478 B2* | 6/2011 | Saito et al. | 716/113 |
| 8,204,721 B2* | 6/2012 | Victory et al. | 703/2 |
| 2005/0132306 A1* | 6/2005 | Smith et al. | 716/1 |
| 2005/0235246 A1* | 10/2005 | Smith et al. | 716/21 |
| 2007/0100591 A1* | 5/2007 | Harazaki | 703/2 |
| 2009/0019408 A1* | 1/2009 | Saito et al. | 716/5 |
| 2012/0013334 A1* | 1/2012 | Sheiretov et al. | 324/252 |
| 2012/0151422 A1* | 6/2012 | White et al. | 716/54 |

OTHER PUBLICATIONS

Kahng, A., et al. "Exploiting STI Stress for Performance," Computer-Aided Design, ICCAD 2007. Nov. 4-8, 2007. pp. 83-90.
Rubinstein, J.A. "Pattern Matching for Advanced Lithographic Technologies," Electrical Engineering and Computer Sciences University of California at Berkeley. Technical Report No. USC/EECS-2010-72. http://www.eecs.berkeley.edu/Pubs/TechRpts/2010/EECS-2010-72.pdf. May 13, 2010.

* cited by examiner

*Primary Examiner* — Suchin Parihar
(74) *Attorney, Agent, or Firm* — Ingrassia Fisher & Lorenz, P.C.

(57) ABSTRACT

A method for fabricating an integrated circuit is disclosed that includes, in accordance with an embodiment, providing a logical design for the semiconductor device and comparing an element in the logical design to a library of element patterns. The library of element patterns is derived by identifying layout patterns having electrical properties that deviate from modeled properties; the library also includes a quantitative measure of deviation from the modeled properties. In response to the comparing and with consideration of the quantitative measure, a determination is made as to whether the element is acceptable in the logical design. A mask set is generated that implements the logical design using either the element or a modified element if the element is not acceptable, and the mask set is employed to implement the logical design in and on a semiconductor substrate.

18 Claims, 3 Drawing Sheets

METHODS FOR FABRICATING AN ELECTRICALLY CORRECT INTEGRATED CIRCUIT

TECHNICAL FIELD

The present invention generally relates to methods for fabricating an integrated circuit, and more particularly relates to methods that include determining layout sensitivities for fabricating an electrically correct integrated circuit.

BACKGROUND

Modern integrated circuits (ICs), can include millions of transistors fabricated in and on a semiconductor substrate. In making a lithographic mask to fabricate such a complex device a circuit layout will pass through a variety of filters, checks, and modifications before being taped out to a mask. Ideally the process results in a mask that can be manufactured (lithographically printed) without defects and in an integrated circuit that is electrically functional.

The layout may contain standard cells and standard device designs as well as new cell and device designs, and must comply with rigid design rules that include minimum feature size, minimum spacing between device elements, and the like. An evolving layout likely passes through multiple simulations, many of which are time consuming. Short cuts are available to reduce simulation time, and hence cost, without sacrificing accuracy of the design. One method for providing approximate but fast evaluation of sensitivity of the layout to lithographic effects that can affect variability and yield is pattern matching. Pattern matching is used to determine lithographic or printability problems. Printability problems are problems in which a pattern on a mask, for example a particular array of lines and spaces, cannot be accurately reproduced on a semiconductor wafer by a lithographic process. In pattern matching single layer patterns that are known to cause printability problems are identified from different product layouts. These patterns form a library and designers and design tools avoid these patterns in implementing future designs. In practice an evolving layout design can be subjected to pattern matching software to identify patterns in the layout design that are similar to the library patterns. Patterns that are similar to library patterns are changed or replaced.

Although pattern matching can be successfully implemented to avoid most printability problems, pattern matching does not target multi-layer layout patterns that can cause electrical problems in the completed IC. Accordingly, it is desirable to provide methods for fabricating an integrated circuit that targets electrically correct layouts. In addition, it is desirable to provide methods for fabricating an integrated circuit that minimize design time and avoid electrical fault areas. Further, it is desirable to provide methods for fabricating an integrated circuit that reduce electrical variability and improve electrical performance. Furthermore, other desirable features and characteristics of the present invention will become apparent from the subsequent detailed description and the appended claims, taken in conjunction with the accompanying drawings and the foregoing technical field and background.

BRIEF SUMMARY

A method for fabricating an integrated circuit is provided that, in accordance with an embodiment, includes providing a logical design for the integrated circuit and comparing an element in the logical design to a library of element patterns. The library of element patterns is derived by identifying layout patterns having electrical properties that deviate from modeled properties; the library also includes a quantitative measure of deviation from the modeled properties. In response to the comparing and with consideration of the quantitative measure, a determination is made as to whether the element is acceptable in the logical design. A mask set is generated that implements the logical design using either the element or a modified element if the element is not acceptable, and the mask set is employed to implement the logical design in and on a semiconductor substrate.

In accordance with a further embodiment, a method is provided for fabricating an integrated circuit that includes identifying a library of layout patterns that exhibit electrical characteristics differing from modeled characteristics. The physical parameters of the layout patterns are perturbed to determine a range of differences from the modeled characteristics. A preliminary design for the integrated circuit is established with the preliminary design including a plurality of design layout patterns. The plurality of design layout patterns is compared to the library of layout patterns and for any of the plurality of design layout patterns bearing a similarity to any of the library of layout patterns a determination is made as to whether the range of differences for that design layout pattern is an acceptable difference. The design layout pattern of any design layout pattern that exhibits an unacceptable range of differences is modified, and a mask set for the integrated circuit is established that includes a plurality of design layout patterns including any design layout patterns that have been modified. The mask set is employed to implement the logical design in and on a semiconductor substrate.

In accordance with yet another embodiment, a method for fabricating an integrated circuit is provided that includes providing a logical design for the integrated circuit and implementing the logical design in a preliminary circuit layout using an arrangement of a plurality of standard design elements. The plurality of standard design elements and the arrangement thereof are compared to a library of multi-layer layout patterns that have been determined to produce measured electrical parameters that differ from modeled parameters. A change is made to a first standard design element or arrangement thereof that matches a multi-layer layout pattern of the library to reduce the difference from modeled parameters. The change is then applied to any of the plurality of standard design elements and the arrangements thereof that is similar to the first standard design element or arrangement thereof. A mask set is generated using the arrangement of the plurality of standard design elements or any changes thereof and is employed to implement the logical design in and on a semiconductor substrate.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

As noted above, modern integrated circuits (ICs) can include millions of transistors. The design of such complex devices relies on standard modeling or simulation techniques to evaluate the design. Device simulation software such as SPICE (Simulation Program with Integrated Circuit Emphasis) for modeling on a device level and timing models for simulating standard cells are well known.

As the complexity and size of integrated circuits increases it becomes necessary to reduce the size of individual devices and the features making up those devices. To maintain device performance in the reduced size devices steps must be taken to enhance carrier mobility, tailor threshold voltages, and the like. For example, SiGe may be inserted under the channel of an MOS transistor to apply a stress to the channel and to thereby increase carrier mobility in the channel. Additionally, carrier mobility can be increased by embedding SiGe (eSiGe) in the source and drain regions of a p-channel MOS transistor. Carrier mobility can also be increased, in both p-channel and n-channel MOS devices by applying a properly formulated stress layer overlying the gate electrode of the devices. Threshold voltages can be tailored by selecting the appropriate gate insulator (e.g., high k dielectrics), gate electrode material (doped polycrystalline silicon or a variety of different metals), and by implanting impurity ions into the channel region of the device.

Although the standard simulation software and timing models may be able to model the effect of these steps for an individual device, they are not able to accurately model all the interactions of the device with adjacent devices and structures, nor are they able to accurately model all the effects of position of a die on a wafer with the resulting differences in processing attendant with that position.

Figure 1:
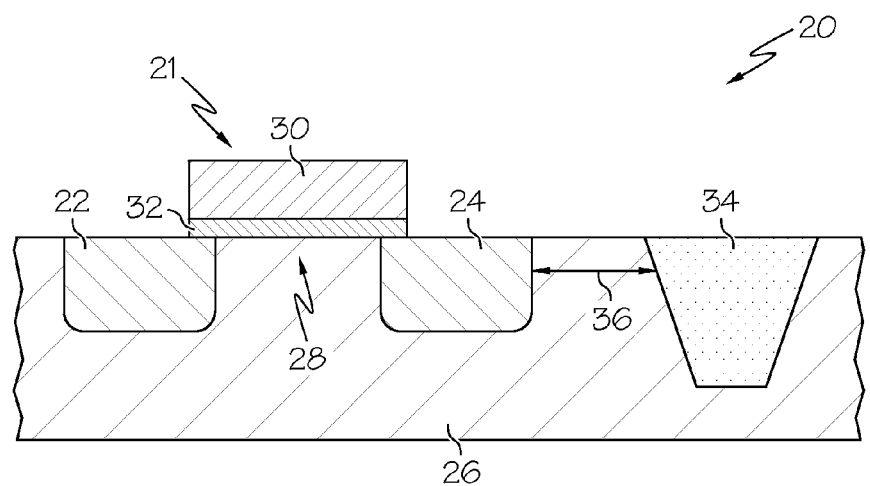
FIG. 1 depicts schematically, in cross section, a portion of a semiconductor device illustrating a modeling problem.

FIG. 1 depicts schematically, in cross section, a portion of a semiconductor device 20 that illustrates one such simulation problem. Device 20 includes a p-channel MOS transistor 21 having a source region 22 and a spaced apart drain region 24 formed in a semiconductor substrate 26. A channel region 28 lies at the surface of the substrate between the source and drain. A gate electrode 30 overlies the channel region and is separated from the channel region by a gate insulator 32. An electrical isolation region 34 such as shallow trench isolation (STI) is spaced apart from the drain by a distance indicated by double headed arrow 36. Isolation region 34 serves to isolate MOS transistor 21 from adjacent devices (not illustrated). If source region 22 and drain region 24 include eSiGe, they provide a compressive longitudinal stress on channel region 28 and enhance the mobility of majority carrier holes in the channel region. It is known that the spacing 36 and the width of isolation region 34 influences the amount of stress applied to the channel region by the embedded SiGe; the closer the spacing, the more the amount of the stress is reduced. The standard simulation software and timing models are not able to accurately model the effect of isolation region width, and relying only on such models may result in a defective or sub-standard integrated circuits because the mobility and hence the gain of transistor 21 may be less than the model predicts.

Figure 2:
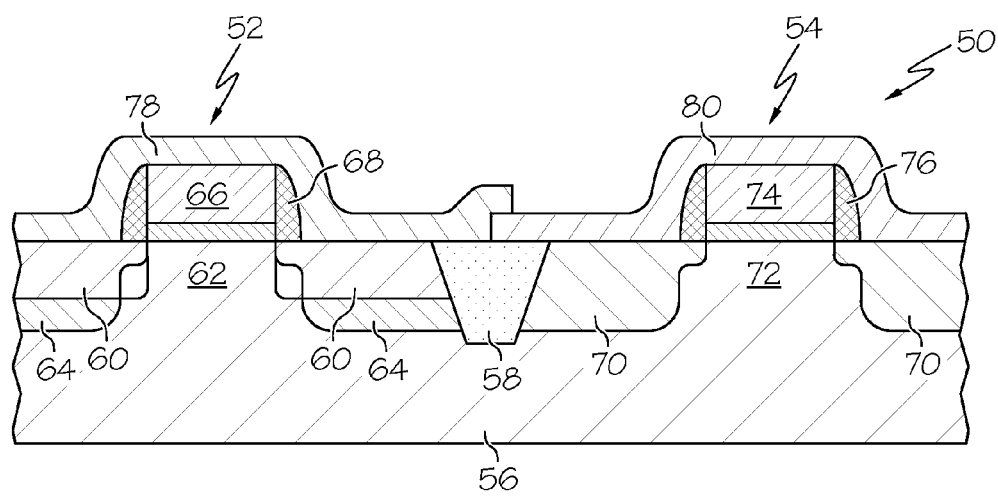
FIG. 2 depicts schematically, in cross section, a portion of an integrated circuit illustrating a modeling problem.

FIG. 2 depicts schematically, in cross section, a portion of an IC 50 that illustrates a further simulation problem. The depicted portion of IC 50 includes a p-channel MOS transistor 52 and an n-channel MOS transistor 54, each formed in and on a semiconductor substrate 56. The two transistors are electrically isolated by an isolation region 58 such as a shallow trench isolation (STI) region. In accordance with one embodiment p-channel transistor 52 includes embedded silicon germanium (eSiGe) regions 60 on either side of a channel region 62. P-type source and drain regions 64 are formed in and through the eSiGe regions. A gate structure 66 including a gate insulator and a gate electrode overlies the channel region. Sidewall spacers 68 are formed on the edges of the gate structure. N-channel transistor 54 includes source and drain regions 70 on either side of a channel region 72. A gate structure 74 overlies channel region 72. Sidewall spacers 76 are formed on the edges of the gate structure. In accordance with this embodiment a dual stress liner (DSL) is used to enhance the mobility of majority carriers in both channel region 62 of p-channel MOS transistor 52 and channel region 72 of n-channel MOS transistor 54. The dual stress liner includes a compressive stress liner 78 overlying gate structure 66 of the p-channel MOS transistor and a tensile stress liner 80 overlying gate structure 74 of the n-channel transistor. The stress liners can each be formed by depositing a silicon nitride layer, with the stress characteristics of each liner determined by the deposition conditions. Typically the compressive stress liner 78 overlies tensile stress liner 80 at the intersection between the two liners to insure that there is no spacing between the two liners. The standard simulation software and timing models are not able to accurately model the effects of the DSL, and especially the interaction of two adjacent stress liners in combination with eSiGe regions and intervening STI. Accordingly, relying only on standard models and simulation may result in a defective or sub-standard IC because the mobility and hence the gain of the transistors used to implement the IC may be different than the models and simulation predict.

Figure 3:
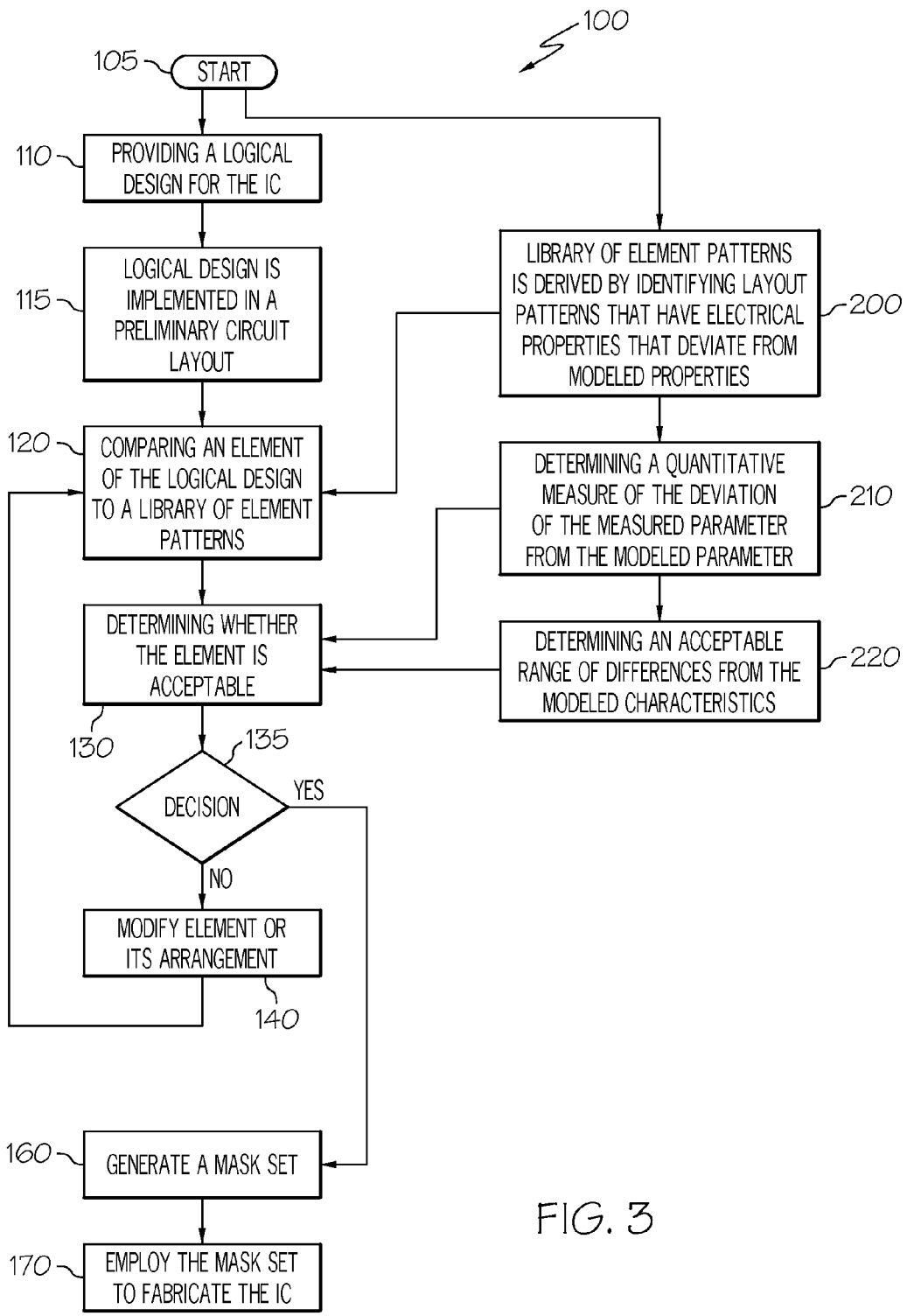
FIG. 3 illustrates, in flow chart form, methods in accordance with various embodiments for fabricating an electrically correct integrated circuit.

FIG. 3 illustrates, in flow chart form, various embodiments of method 100 for fabricating an integrated circuit (IC) having an electrically correct layout. Method 100 begins as illustrated in start block 105 and then proceeds in block 110 by providing a logical design for the IC being fabricated. The logical design is implemented in a preliminary circuit layout that includes an arrangement of a plurality of design layout patterns including elements such as transistors, standard cells, small logic blocks, standard design elements, and the like as illustrated in block 115. Pattern matching can be applied to the preliminary circuit design to determine printability problems, and those problems can be addressed in the normal manner. The method continues, as illustrated in block 120, by comparing an element of the logical design and its arrangement with respect to other elements to a library of element patterns to determine whether the element of the logical design matches an element pattern of the library.

As illustrated in block 200, the library of element patterns is derived by identifying layout patterns that have electrical properties that deviate from modeled properties. The layout patterns can be identified by fabricating physical test structures, measuring device and circuit parameters on those test structures, and comparing the measured parameters to parameters predicted by standard device and timing models. The physical test structures can be, for example, semiconductor devices fabricated using standard semiconductor processing techniques and for which physical properties or layout dimensions are adjusted or perturbed as explained more fully below. For example, the spacing between adjacent impurity doped regions is varied, the spacing between impurity doped regions and adjacent STI regions is varied, the physical boundaries of layout patterns are changed, and the like. The variations in the test structures are selected to mimic changes that might be encountered in the IC being fabricated and allows the measuring of the effect of stress-induced or other stimulant-induced changes on the measured parameter caused by the changing of spacing and other perturbations. The structures are designed to detect effects that have not been modeled and effects that cannot be accurately modeled. The variations in the test structure can involve changes in multiple layers in the device processing. For example, changes may be made in size and/or location of isolation regions, impurity doped regions, polycrystalline silicon gates and interconnects, metal interconnects, contact size and number, and the like.

Figure 4:
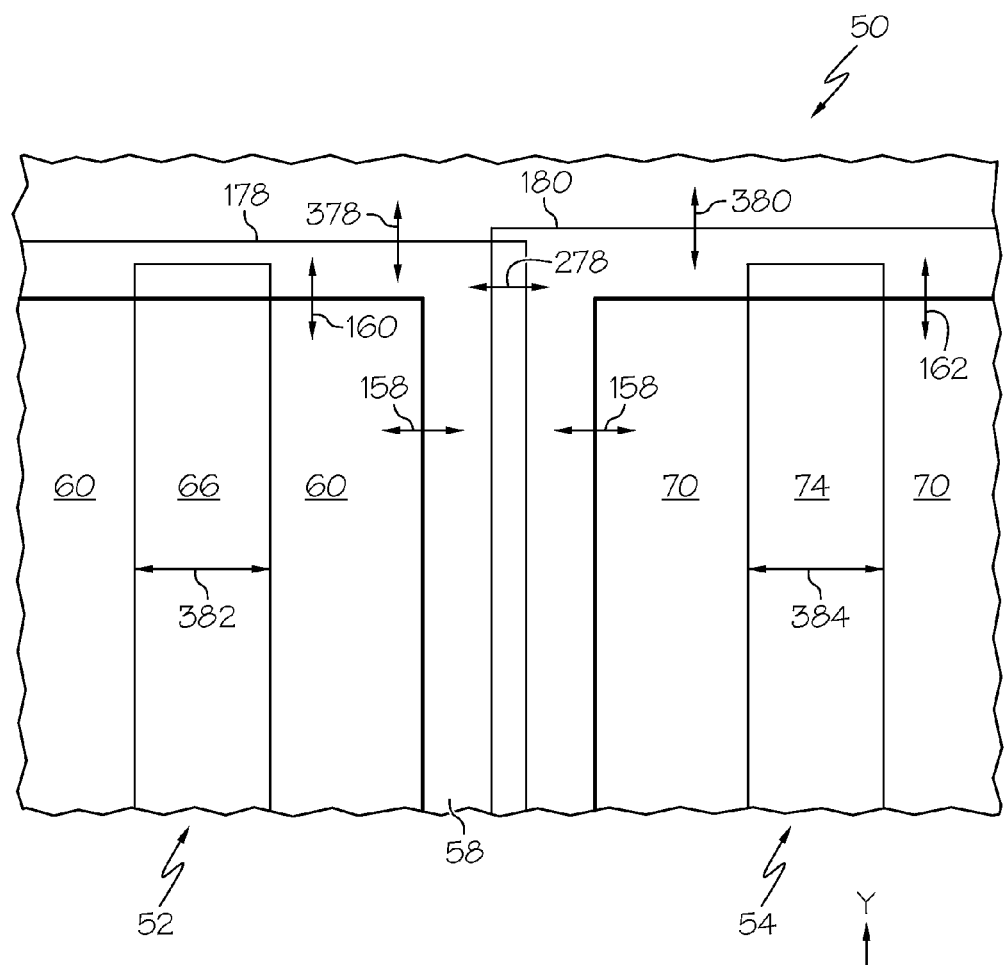
FIG. 4 depicts, in plan view, a portion of an integrated circuit illustrating possible perturbations that can be incorporated into various test structures.

FIG. 4 depicts, in plan view, a portion of a semiconductor IC 50 similar to that depicted in FIG. 2 that illustrates some, but certainly not all, of the perturbations that can be incorporated into various test structures. IC 50 includes a p-channel MOS transistor 52 and an n-channel MOS transistor 54. A shallow trench isolation structure (STI) 58 (shown in bold lines) serves to electrically isolate the two transistors. Embedded silicon germanium (eSiGe) 60 has been employed with p-channel MOS transistor 52 to enhance the mobility of holes in the channel underlying gate electrode structure 66. Source and drain regions 70 are spaced apart on opposite sides of gate electrode structure 74 of transistor 54. To avoid complicating the FIGURE, a number of elements have not been depicted in this view such as sidewall spacers, the source and drain regions of transistor 52, the details of source and drain extensions, and the like. The edges of compressive stress liner 78 are indicated by the line 178 and the edges of tensile stress liner 80 are indicated by the line 180. Some of the perturbations that can be implemented in test structures that are to be fabricated and measured or that are to be extensively simulated and modeled include perturbations in the borders of the STI and in the borders of each of the dual stress liners. For example, either of the boundaries of STI region 58 can be moved in either the plus or minus x direction as indicated by double headed arrows 158 or in the plus or minus y direction as indicated by double headed arrow 160 for p-channel MOS transistor 52 or by double headed arrow 162 for n-channel MOS transistor 54. Moving the boundary of the STI region in the y-direction will also change the channel width, W, of the transistors. Similarly, the perturbations can include moving the boundaries of the compressive stress liner 78 and the tensile stress liner 80 in the plus or minus x direction as indicated by double headed arrow 278. The overlap between the compressive stress liner and the tensile stress liner is generally fixed, so moving one stress liner in the x direction generally also implies moving the other stress liner in the same direction. The perturbations can further include moving the boundary of the compressive stress liner in the plus or minus y direction as indicated by double headed arrow 378 or moving the boundaries of the tensile stress liner 80 in the plus or minus y direction indicated by the double headed arrow 380. Still further, possible perturbations can include changes in channel length, L, as indicated by double headed arrows 382 for p-channel MOS transistor 52 and double headed arrows 384 for n-channel MOS transistor 54. Although not illustrated in FIG. 4, other possible perturbations that can be incorporated into various test structures include but are not limited to changes in the number and/or size of contacts to the source and drain regions, the distance from the active areas to the dual stress liner boundaries, and the like. Similar test structures can also be located at various positions on the semiconductor wafer to measure the effects of process variation, for example the differences in chemical mechanical planarization (CMP) results or deposition conditions, across the wafer. The library of element patterns can also be identified by detailed modeling and simulation of the physical test structures and comparing results of such detailed modeling and simulation with results of standard modeling such as SPICE. While such in depth modeling is available for use on small scale test structures, its use on the entire IC would be prohibitively time consuming.

Referring again to FIG. 3, as illustrated in block 210 the method in accordance with one embodiment continues by determining a quantitative measure of the deviation of the measured parameter from the modeled parameter. If measurements made on test pattern variations fall within a predetermined range, those similar test patterns are mapped into a single performance group or bin. For example, if the change in some spacing on the test device results in a change of 3% or less, all such test patterns are considered similar. Such a change in spacing that produces a change of less than 3% from the model predicted measurement might be considered to be of no significance. The number 3% is used here as merely an illustration; in practice, any predetermined range can be used. Multiple performance bins corresponding to different ranges can be established. As illustrated in block 220, the method in accordance with an embodiment continues by determining a range of differences from the modeled characteristics that are considered to be acceptable, that is, which would not adversely affect the performance of the IC being fabricated. Differences that exceed some determined threshold amount are deemed to be unacceptable.

The method in accordance with one embodiment continues as illustrated in box 130 by determining, in response to the comparison done in box 120, whether the element is acceptable in the logical design. The determination is made with consideration of the quantitative measure determined in box 210 and the determination of an acceptable range of differences of box 220.

The method leads to decision box 135. In accordance with the determination made in box 130, if the element and its arrangement with respect to other elements is determined not to match an element of the library of element patterns or is otherwise deemed acceptable in consideration of the quantitative measure determined in box 210, that element is passed to box 160 to be used in generating a mask set as discussed below. In further accordance with this determination, as illustrated in box 140, if the element or its arrangement to other elements matches an element of the library of element patterns and is determined not to be acceptable, that is, the element or its arrangement with respect to other elements would be expected to cause a deviation from expected modeled parameters by more than a threshold amount, changes are made to that element or its arrangement. The changes can include, for example, changing the spacing between an impurity doped region and an isolation region or any of the other perturbations discussed above, and can involve multi-layer layout pattern changes. The modified element is then subjected to the comparison of box 120. If the modified element is deemed to be acceptable according to the criteria of box 130, the same change is applied to any design elements and its arrangement thereof that is similar to the tested design element and its arrangement with respect to other elements.

The elements and their arrangement with respect to other elements that have been determined to be acceptable in the logical design and the modified elements and their arrangement to other elements that have been determined to be acceptable are used to generate a mask set as indicated at box 160. The mask set implements the logical design in an electrically correct layout and includes a plurality of design layout patterns and design layout patterns that have been modified.

As indicated in box 170, the method is completed by employing the mask set generated in box 160 to fabricate the semiconductor device by implementing the logical design in and on a semiconductor substrate.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit comprising:
providing a logical design for the integrated circuit, the logical design including a plurality of elements;
developing a library of element patterns derived by identifying layout patterns having electrical properties that deviate from modeled properties using a software tool on a computer, the library further including a quantitative measure of deviation from modeled properties, wherein the step of developing comprises:
measuring electrical parameters on semiconductor test devices and comparing measured parameters to results generated by standard models using the software tool on the computer,
adjusting physical properties of the semiconductor test devices and determining the effect on the measured parameters using the software tool on the computer, and
determining the quantitative measure of deviation caused by the adjusted physical properties using the software tool on the computer and grouping results in measured parameters falling within a specified range;
comparing elements in the logical design to the library of element patterns using the software tool on the computer;
determining, in response to the comparing and with consideration of the quantitative measure, whether the elements are acceptable in the logical design using the software tool on the computer;
modifying elements that are not acceptable;
generating a mask set implementing the logical design using the elements or modified elements;
employing the mask set to implement the logical design in and on a semiconductor substrate.

2. The method of claim 1 wherein the step of adjusting comprises changing spacing between features of the element and measuring the effect of stress on the measured parameters caused by the changing of spacing.

3. The method of claim 1 wherein the step of determining in response to the comparing comprises determining whether measured parameters falling within the specified range are acceptable for the logical design.

4. The method of claim 1 wherein the step of measuring electrical parameters comprises measuring the effect of feature spacing on the electrical parameters.

5. The method of claim 1 wherein the step of measuring electrical parameters comprises measuring the effect of device location on a semiconductor substrate on the electrical parameters.

6. The method of claim 1 wherein the step of developing a library comprises detailed modeling and simulation of the electrical response associated with an element pattern using the software tool on the computer.

7. The method of claim 1 wherein the step of generating a mask set comprises modifying an element by modifying a physical spacing if the element is determined to cause a quantitative measure of deviation greater than a threshold amount.

8. A method for fabricating an integrated circuit comprising:
identifying a library of layout patterns that exhibit electrical characteristics differing from modeled characteristics using a software tool on a computer;
perturbing physical parameters of the layout patterns to determine a range of acceptable differences from the modeled characteristics;
establishing a preliminary design for the integrated circuit, the preliminary design including a plurality of design layout patterns;
comparing the plurality of design layout patterns to the library of layout patterns and for any of the plurality of design layout patterns bearing a similarity to any of the library of layout patterns ascertaining whether the range of differences for that design layout pattern is an acceptable difference;
modifying the design layout pattern of any design layout pattern that exhibits an unacceptable range of differences using the software tool on the computer;
establishing a mask set for the integrated circuit comprising a plurality of design layout patterns including any design layout patterns that have been modified; and
employing the mask set to implement the logical design in and on a semiconductor substrate.

9. The method of claim 8 wherein the step of identifying comprises identifying layout patterns exhibiting stress induced differences of electrical parameters.

10. The method of claim 8 wherein the step of perturbing comprises:
changing physical boundaries of a layout pattern;
measuring electrical characteristics of the layout pattern with changed physical boundaries; and
grouping layout patterns having similar electrical characteristics.

11. The method of claim 8 wherein the step of identifying comprises measuring electrical characteristics on test structure layout patterns.

12. The method of claim 8 wherein the step of identifying comprises modeling electrical characteristics of simulated layout patterns using the software tool on the computer.

13. A method for fabricating an integrated circuit comprising:
providing a logical design for the integrated circuit;
implementing the logical design in a preliminary circuit layout using an arrangement of a plurality of standard design elements;
comparing the plurality of standard design elements and the arrangement thereof to a library of multi-layer layout patterns that have been determined to produce measured electrical parameters that differ from modeled parameters using a software tool on a computer;

making a change to a first standard design element or arrangement thereof that matches a multi-layer layout pattern of the library to reduce the difference from modeled parameters;

applying the change to any of the plurality of standard design elements and the arrangements thereof that is similar to the first standard design element or arrangement thereof;

generating a mask set using the arrangement of the plurality of standard design elements and any changes thereof; and employing the mask set to implement the logical design in and on a semiconductor substrate.

14. The method of claim 13 wherein the step of making a change comprises changing the spacing between an impurity doped region and an isolation region.

15. The method of claim 13 wherein the step of making a change comprises making a change to more than one layer of the first standard design element.

16. The method of claim 13 further comprising the step of applying pattern matching to the preliminary circuit layout using the software tool on the computer to determine printability problems.

17. The method of claim 13 further comprising the step of developing the library of multi-layer layout patterns using the software tool on the computer by identifying layout patterns having electrical properties that deviate from modeled properties.

18. The method of claim 17 wherein the step of developing comprises measuring device parameters on a physical semiconductor test structure.

* * * * *